United States Patent
Hsieh et al.

(10) Patent No.: US 9,591,794 B2
(45) Date of Patent: Mar. 7, 2017

(54) FEEDER SYSTEM AND MATERIAL GUIDING CARRIER THEREOF

(71) Applicant: Wistron Corp., New Taipei (TW)

(72) Inventors: Hao-Chun Hsieh, New Taipei (TW); Chang-Lung Chen, New Taipei (TW); Pi-Chiang Huang, New Taipei (TW)

(73) Assignee: WISTRON CORP., New Taipei (TW)

( * ) Notice: Subject to any disclaimer, the term of this patent is extended or adjusted under 35 U.S.C. 154(b) by 248 days.

(21) Appl. No.: 14/284,165

(22) Filed: May 21, 2014

(65) Prior Publication Data
US 2015/0195962 A1 Jul. 9, 2015

(30) Foreign Application Priority Data

Jan. 3, 2014 (TW) .............................. 103100259 A

(51) Int. Cl.
*H05K 13/02* (2006.01)
*H05K 13/04* (2006.01)
*H05K 13/00* (2006.01)

(52) U.S. Cl.
CPC .............................. *H05K 13/0434* (2013.01)

(58) Field of Classification Search
CPC .................................................. H05K 13/0434
USPC ............................... 414/300, 224.01, 222.01
See application file for complete search history.

(56) References Cited

U.S. PATENT DOCUMENTS 2,893,009 A * 7/1959 Bergsland .......... H05K 13/0495
174/260
4,701,096 A * 10/1987 Fisher, Jr. .......... H01L 21/67313
198/346.1
4,873,762 A * 10/1989 Elliott .................. B23P 19/001
221/197
4,953,749 A * 9/1990 Kubota ................ H05K 13/027
221/168
5,249,906 A * 10/1993 Nakagawa ........... H05K 13/028
100/237

(Continued)

FOREIGN PATENT DOCUMENTS

JP WO 2012060368 A1 * 5/2012 ......... H05K 13/0084
TW M377260 U1 4/2010

OTHER PUBLICATIONS

Machine Translation Espacenet Description: Hori Shigeo WO2012060368 (A1) May 10, 2012.*

*Primary Examiner* — Charles A Fox
*Assistant Examiner* — Joseph J Sadlon
(74) *Attorney, Agent, or Firm* — Maschoff Brennan

(57) ABSTRACT

The disclosure provides a feeder system, for providing multiple materials from a tube, including a transportation platform and a material guiding carrier. The material guiding carrier is mounted on the transportation platform. The material guiding carrier includes a material input portion and a material output portion. A material output opening of the tube is located at the material input portion. The materials from the tube are conveyed to the material guiding carrier by the transportation platform. At least two guiding members are mounted on the material guiding carrier for matching the tube in an adjustable manner to guide the materials from the material input portion to the material output portion along a material feeding direction. The material feeding direction and an arrangement of the at least two guiding members are parallel to each other.

18 Claims, 5 Drawing Sheets

(56) References Cited

U.S. PATENT DOCUMENTS

| | | | | |
|---|---|---|---|---|
| 6,030,172 | A * | 2/2000 | Wong Han Boon | H05K 13/021 414/797.8 |
| 6,645,355 | B2 * | 11/2003 | Hanson | H01L 21/67173 204/198 |
| 7,198,819 | B2 * | 4/2007 | Kang | H01L 51/0015 118/728 |
| 8,043,039 | B2 * | 10/2011 | Yamamoto | H01L 21/67766 414/217 |
| 8,293,066 | B2 * | 10/2012 | Bluck | H01L 21/67173 118/719 |
| 2011/0048319 | A1 * | 3/2011 | Inoue | B65G 49/065 118/300 |
| 2011/0232082 | A1 * | 9/2011 | Kim | H01L 21/67144 29/740 |
| 2012/0031333 | A1 * | 2/2012 | Kurita | C23C 16/4587 118/719 |
| 2013/0167369 | A1 * | 7/2013 | Oh | H01L 21/67144 29/740 |
| 2014/0161573 | A1 * | 6/2014 | Chen | B65B 69/00 414/416.04 |
| 2014/0271056 | A1 * | 9/2014 | Peng | H05K 13/0061 414/222.01 |

\* cited by examiner

FEEDER SYSTEM AND MATERIAL GUIDING CARRIER THEREOF

CROSS-REFERENCE TO RELATED APPLICATIONS

This non-provisional application claims priority under 35 U.S.C. §119(a) on Patent Application No(s). 103100259 filed in Taiwan, R.O.C. on Jan. 3, 2014, the entire contents of which are hereby incorporated by reference.

TECHNICAL FIELD

The disclosure relates to a feeder system, and more particularly to a feeder system suitable for tubes with different sizes.

BACKGROUND

With the improvement of technology, electronic devices are developed towards being small in size and light in weight. As for a printed circuit board, conventionally, operators insert an electronic component on the circuit board by a Dual Inline Package (DIP) manner. Using the DIP manner, the printed circuit board needs to be drilled to form several holes in which pins of the electronic component insert. However, such a structure may affect the distribution and disposition of the wires of the printed circuit board, so the volume of the printed circuit board cannot be reduced. Moreover, the pins of the printed circuit board may affect the total volume and weight.

In recent years, manufacturers developed a Surface Mount Technology (SMT) that a pin-type electronic component is packaged into a chip-type electronic component to become a Surface Mount Device (SMD) which is filled in a tube. The SMD is dropped from the tube and adhered and welded on the printed circuit board. In such a manner, the printed circuit board may not be drilled, and the printed circuit board may be manufactured into multiple layers, and the volume of the electronic component can be reduced. Thus, the volume and weight of the printed circuit board can be greatly reduced accordingly.

Conventionally, the tube is fixed on a carrier (or jig), and a nozzle of a robotic manipulator (namely, robot arm) picks up or sucks a material (namely, the electronic component) from the tube before placing the material on the printed circuit board. However, since the sizes of the tubes are different from each other, each tube needs to match its specific carrier. When the tube needs to be replaced by another one, the carrier which matches the original tube must be replaced by another corresponding one, too. The replacement of the new carrier may affect the manufacturing cost and efficiency. Furthermore, the tube may be attached on the carrier by tape, but this kind of fixation may not securely fix the tube, which makes the tube oblique. Therefore, the material may not be precisely located on the right position of the carrier.

SUMMARY

An embodiment of the disclosure provides a feeder system, for providing a plurality of materials from a tube, comprising a transportation platform and a material guiding carrier. The material guiding carrier is mounted on the transportation platform. The material guiding carrier includes a material input portion and a material output portion. A material output opening of the tube is located at the material input portion. The plurality of materials from the tube are conveyed to the material guiding carrier by the transportation platform. At least two guiding members are mounted on the material guiding carrier for matching the tube in an adjustable manner to guide the plurality of materials from the material input portion to the material output portion along a material feeding direction. The material feeding direction and an arrangement of the at least two guiding members are parallel to each other.

Another embodiment of the disclosure provides a material guiding carrier, for conveying a plurality of materials from a tube and being mounted on a transportation platform. The material guiding carrier comprises a material input portion and a material output portion. A material output opening of the tube is located at the material input portion, and the plurality of materials of the tube are conveyed to the material input portion of the material guiding carrier by the transportation platform. At least two guiding members are mounted on the material guiding carrier for matching the tube in an adjustable manner to guide the plurality of materials from the material input portion to the material output portion along a material feeding direction. The material feeding direction and an arrangement of the at least two guiding members are substantially parallel to each other.

BRIEF DESCRIPTION OF THE DRAWINGS

The present disclosure will become more fully understood from the detailed description given hereinbelow, along with the accompanying drawings which are for illustration only, thus are not limitative of the present disclosure, and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The disclosure provides a feeder system, for providing a material from a tube. The material may be placed or assembled on a workpiece. In one embodiment of the disclosure, the material is an electronic component which is attached, adhered or welded on the workpiece. In other words, the material may be a surface mount device (SMD) which is mounted on the workpiece by Surface Mount Technology (SMT). In this embodiment, the workpiece is a printed circuit board. However, the above exemplary material and workpiece are not limited to the disclosure.

Figure 1A:
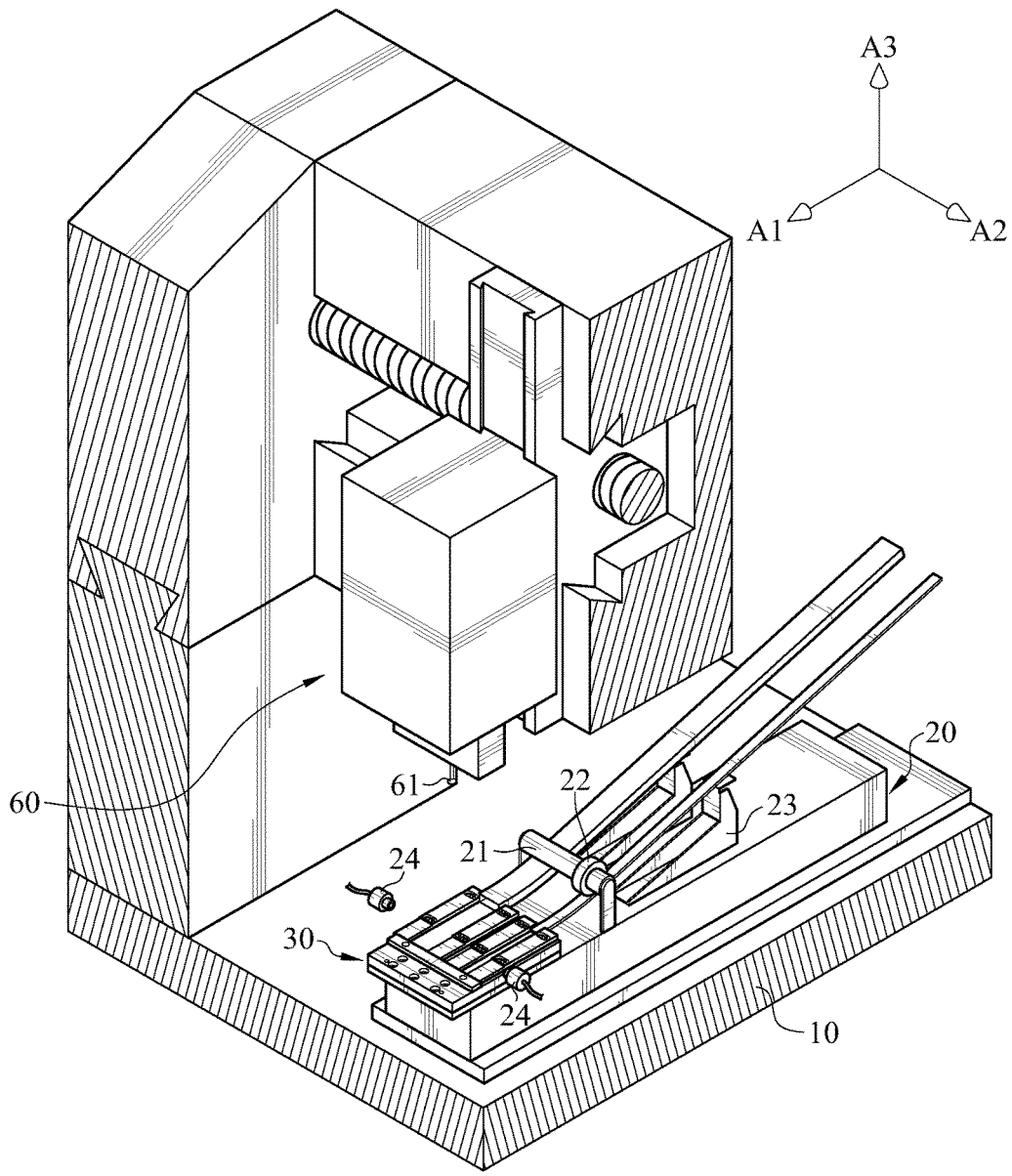
FIGS. 1A and 1B illustrate a perspective view of a feeder system according to an embodiment of the disclosure.
Figure 1B:
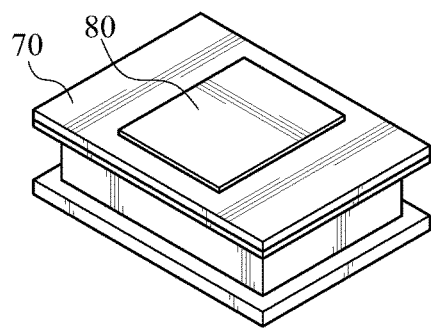
Figure 2:
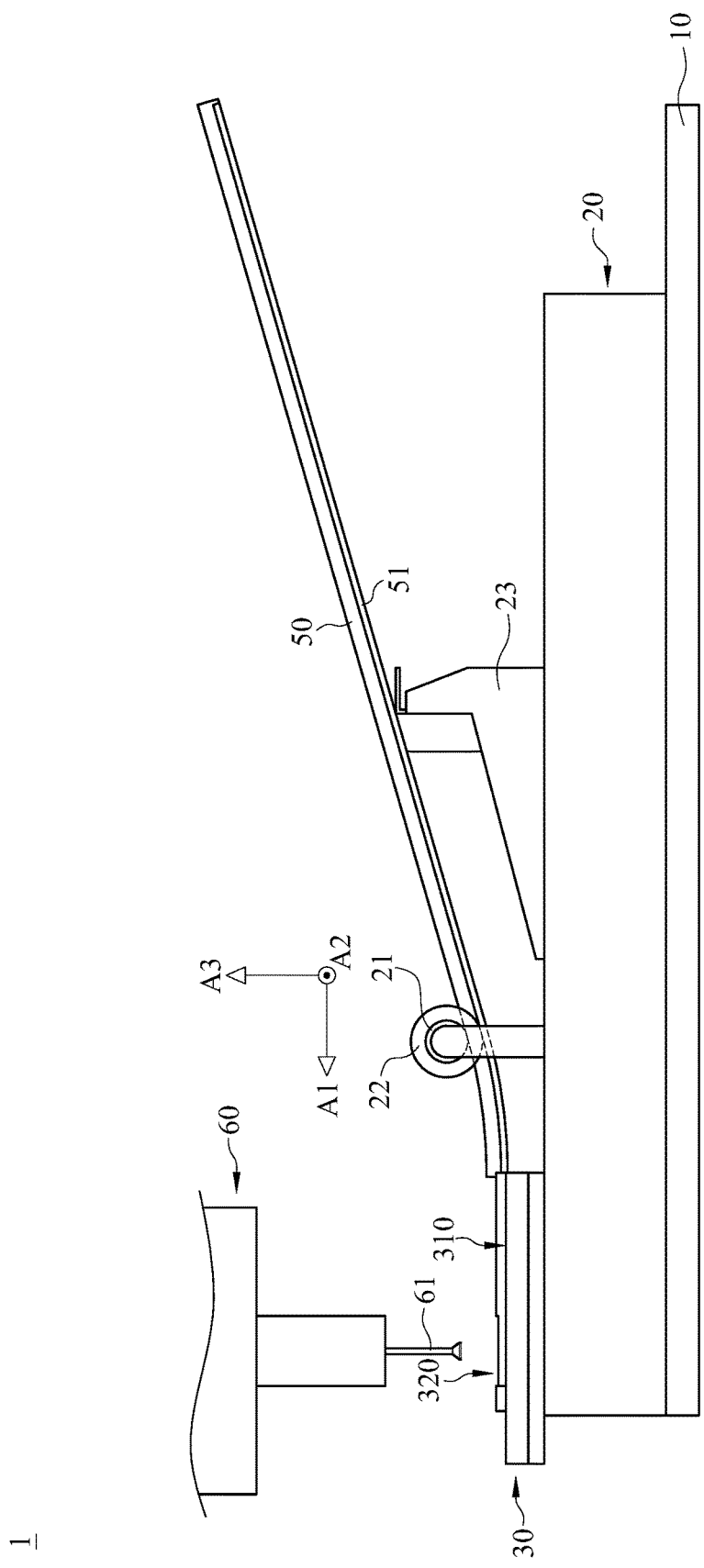
FIG. 2 is a cross-sectional view of the feeder system according to an embodiment of the disclosure.

Please refer to FIGS. 1 and 2, FIG. 1 is a perspective view of a feeder system according to an embodiment of the disclosure, and FIG. 2 is a cross-sectional view of the feeder system according to an embodiment of the disclosure. One embodiment of the disclosure provides a feeder system 1 comprising a base 10, a transportation platform 20, a material guiding carrier 30, guiding members 41, 42, 43, and 44, a placement machine 60 and a machining platform 70. The transportation platform 20 is mounted on the base 10. The material guiding carrier 30 is mounted on the transportation platform 20 and includes a material input portion 310, a material supporting portion 315, and a material output portion 320, and the material supporting portion 315 is located between the material input portion 310 and the material output portion 320. In this embodiment, the transportation platform 20 is adapted to vibrate relative to the base 10, for driving the material guiding carrier 30 to vibrate simultaneously. Moreover, the guiding members 41, 42, 43 and 44 are mounted on the material guiding carrier 30, the guiding members 41 and 42 are adapted to clamp (namely, hold) a tube 50 together, and the guiding members 43 and 44 are adapted to clamp another tube 51 together. In this embodiment, the guiding members 41, 42, 43 and 44 are parallel to each other, but this parallel arrangement of the guiding members 41, 42, 43 and 44 are not limited to the disclosure. Moreover, the machining platform 70 is disposed at a side of the base 10 and adapted to carry a workpiece 80. The placement machine 60 is disposed at a side of the base 10 and adapted to move along a first moving direction A1, a second moving direction A2 and a third moving direction A3 that are perpendicular to each other. The placement machine 60 is adapted to move to correspond to a material output portion 320 of the material guiding carrier 30 or to the workpiece 80 on the machining platform 70. Thus, the placement machine 60 is adapted to pick up materials 90 and 91 on the material output portion 320 before place the material 90 to the workpiece 80 on the machining platform 70. In this embodiment, the placement machine 60 comprises a nozzle 61 for sucking the materials 90 and 91 and placing the materials 90 and 91. However, the feature of sucking the materials 90 and 91 by the nozzle 61 of the placement machine 60 is not limited to the disclosure. In other embodiments, for example, the placement machine 60 picks the materials 90 and 91 up by clamping.

In this disclosure, the material supporting portion is located between the material input portion 310 and the material output portion 320 of the material guiding carrier 30. The material input portion 310 is located at a side of the material guiding carrier 30 connected to the tubes 50 and 51, and the material output portion 320 is located farther away from the tubes 50 and 51 than the material input portion 310. The material output portion 320 includes a supporting platform 325.

Figure 3:
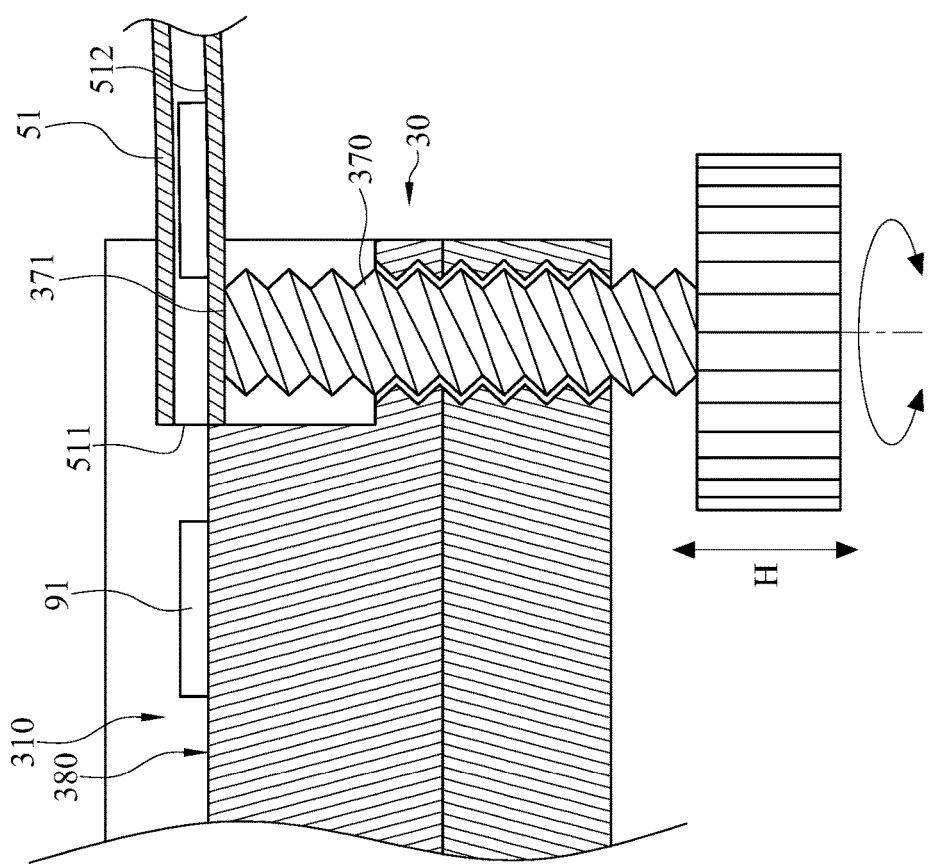
FIG. 3 is a partially cross-sectional view of the feeder system according to an embodiment of the disclosure.
Figure 4A:
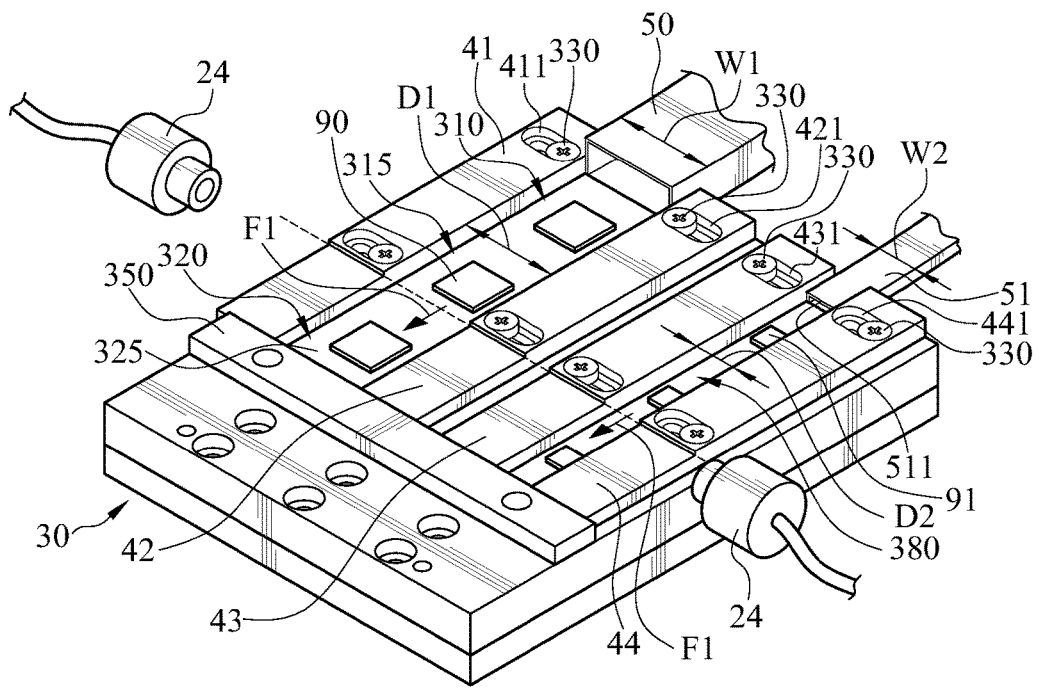
FIG. 4A is a partially perspective view of the feeder system according to an embodiment of the disclosure.

The following describes the arrangements and structures of the material guiding carrier 30, the guiding members 41, 42, 43 and 44 and the tubes 50 and 51. Please refer to FIGS. 2, 3 and 4A, FIG. 3 is a partially cross-sectional view of the feeder system according to an embodiment of the disclosure, and FIG. 4A is a partially perspective view of the feeder system according to an embodiment of the disclosure. In this embodiment, the material guiding carrier 30 further comprises a plurality of fixing members 330, and each guiding member 41, 42, 43 and 44 includes two adjustable slots 411, 421, 431 and 441. The lengths of the adjustable slots 411, 421, 431 and 441 are greater than the outer diameters of the fixing members 330, so the fixing members 330 detachably penetrate through the adjustable slots 411, 421, 431 and 441 and are disposed on the material guiding carrier 30. Take the guiding member 41 for an example, the tube 50 is inserted between the guiding members 41 and 42. The guiding member 41 is moved towards or away from the guiding member 42 along the adjustable slot 411, for adjusting the distance between the guiding members 41 and 42. Therefore, the guiding member 42 may hold an end of the tube 50 on the material input portion 310 of the material guiding carrier 30. Then, the fixing member 330 fixes the guiding member 41 to a relative position on the material guiding carrier 30. As shown in FIG. 4A, a first distance D1 between the guiding members 41 and 42 matching the width W1 of the tube 50 is greater than a second distance D2 between the guiding members 43 and 44 matching the width W2 of the tube 51, and the width W1 is greater than the width W2. Therefore, the guiding members 41 and 42 and the guiding members 43 and 44 are adjusted to tightly clamp the tubes 50 and 51, respectively. When the transportation platform 20 vibrates, the materials 90 and 91 drop from the tubes 50 and 51 to the material guiding carrier 30 before the guiding members 41 and 42 and the guiding members 43 and 44 guide the materials 90 and 91 to be precisely conveyed from the material input portion 310 to the material output portion 320 along the material feeding direction F1 by shaking, respectively.

It should be noted that in this embodiment, the material feeding direction F1 is parallel to the extension direction of the arrangements of the guiding members 41, 42, 43 and 44, and the material feeding direction F1 means the accurate moving direction of the materials 90 and 91 moving from the material input portion 310 to the material output portion 320 for the placement machine 60 picking up.

In this and some other embodiments, the transportation platform 20 comprises pressing wheels 21 and 22 coaxial with each other and an oblique seat 23. The pressing wheels 21 and 22 and the oblique seat 23 are mounted on the base 10, and the pressing wheels 21 and 22 are located between the material guiding carrier 30 and the oblique seat 23. The tubes 50 and 51 are mounted on the oblique seat 23 such that the tubes 50 and 51 incline to an end of the material guiding carrier 30, which prevents the tubes 50 and 51 from moving towards the base 10 along the negative third moving direction A3. The pressing wheels 21 and 22 are adapted to press the tubes 51 and 50, respectively, for preventing the tubes 51 and 50 from moving along the third moving direction A3. Therefore, the tubes 50 and 51 may be smoothly mounted on the material guiding carrier 30. Furthermore, a blocking board 350 is further mounted on the material guiding carrier 30, for preventing the materials 90 and 91 from falling out from the material output portion 320 when shaking to accidentally move to undesired positions.

Referring to FIG. 3, in this and some other embodiments, the material guiding carrier 30 further comprises a height adjusting member 370 including a pressing portion 371. The height adjusting member 370 is movably disposed at the material input portion 310 of the material guiding carrier 30, and the pressing portion 371 is pressed against the tube 51. In this and some other embodiments, the height adjusting member 370 penetrates through the material input portion 310 of the material guiding carrier 30 and is adapted to rotate to move along an axis H relative to the material guiding carrier 30. The pressing portion 371 is adapted to move upward and downward along the axis H relative to the material guiding carrier 30, for adjusting a distance between the tube 51 and the material guiding carrier 30, which makes an inner wall 512 of the material output opening 511 of the tube 51 align with the surface 380 of the material input portion 310 of the material guiding carrier 30. Therefore, the material 90 from the tube 51 may be smoothly dropped to the surface 380 of the material input portion 310.

Please refer to FIGS. 1 and 4A, in this and some other embodiments, the feeder system 1 further comprises an alignment sensor 24 corresponding to the material output portion 320 of the material guiding carrier 30. The alignment sensor 24 is adapted to monitor and/or detect the positions of the materials 90 and 91 to assure whether the materials 90 and 91 are located at the right positions on the material output portion 320 or moved along the right direction on the material output portion 320. Therefore, the precise placement of the feeder system 1 is improved.

Figure 4B:
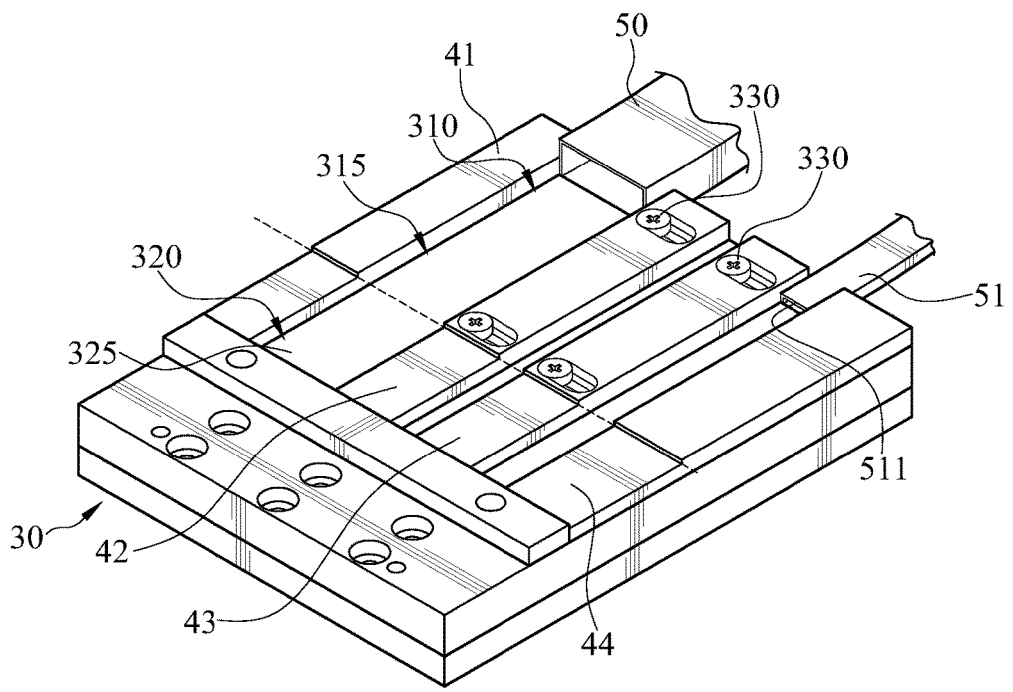
FIG. 4B is a partially perspective view of a feeder system according to another embodiment of the disclosure.

The following describes the detailed structure of the guiding member according to other embodiment of the disclosure. Please refer to FIG. 4B, which is a partially perspective view of a feeder system according to another embodiment of the disclosure. The configuration of this embodiment is similar to that of the above-mentioned embodiment, so the same numerals represent the same structures, and the repeated description for the same structure is not described again. The difference between the above-mentioned embodiments and this embodiment is that two guiding members 41 and 44 are fixedly mounted on the material guiding carrier 30, and other two guiding members 42 and 43 are adapted to be movably mounted on the material guiding carrier 30, for adjusting the distance between the guiding members 41 and 42 and the distance between the guiding members 43 and 44. Take the guiding members 41 and 42 for an example, when the guiding member 41 is fixedly mounted on the material guiding carrier 30 and the guiding member 42 is movably mounted on the material guiding carrier 30, users only need to move the position of only the one guiding member 42, the distance between the guiding members 41 and 42 can be adjusted, and therefore, the guiding members 41 and 42 may match the size of the tube 50. That is to say, the configuration of this embodiment may rapidly adjust the distance between the guiding members 41 and 42, thereby improving the efficiency of placement of materials.

Figure 4C:
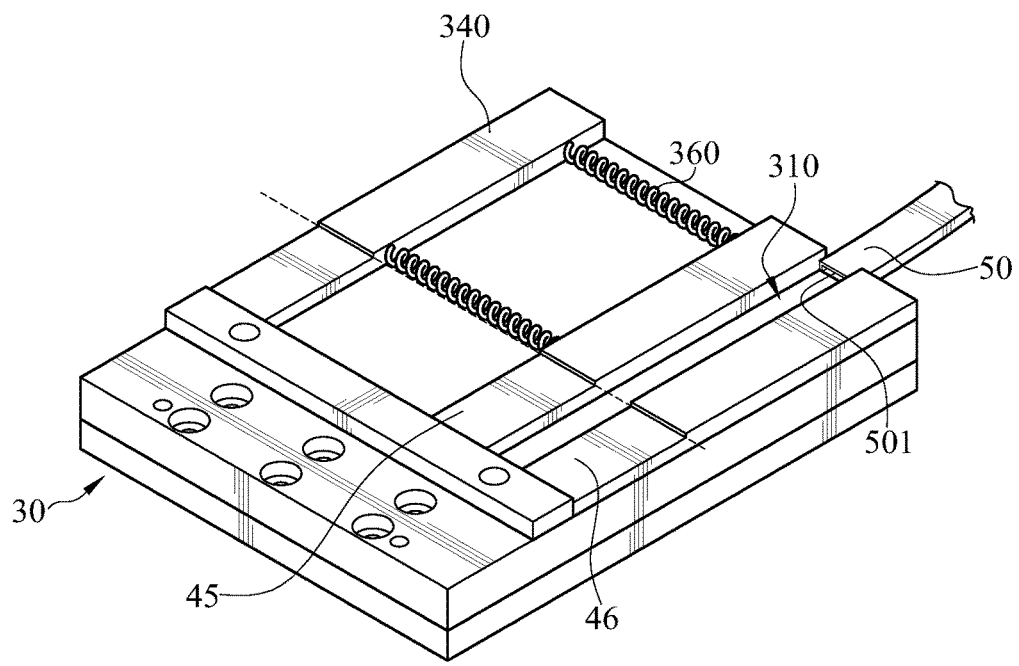
FIG. 4C is a partially perspective view of a feeder system according to yet another embodiment of the disclosure.

The following describes the configuration of other guiding member according to other embodiment of the disclosure. Please refer to FIG. 4C, which is a partially perspective view of a feeder system according to yet another embodiment of the disclosure The configuration of this embodiment is similar to that of the above-mentioned embodiments, so the same numerals represent the same structures, and the repeated description for the same structure is not described again. The material guiding carrier 30 comprises two guiding members 45 and 46, a fixing board 340 and a flexibly restoring member 360. The fixing board 340 and the guiding member 46 are fixedly mounted on the material guiding carrier 30, and two ends of the flexibly restoring member 360 are connected to the fixing board 340 and the guiding member 45, respectively. In this and some other embodiments, the flexibly restoring member 360 is a compression spring, but is not limited to the disclosure. When the tube 50 needs to be mounted on the material guiding carrier 30, users may produce a force to drive the guiding member 45 to move towards the fixing board 340 before placing the tube 50 between the guiding members 45 and 46. Afterwards, users may release the guiding member 45. Then, the guiding member 45 is moved towards the other guiding member 46 by the pushing force produced by the flexibly restoring member 360, such that the two guiding members 45 and 46 clamp the tube 50. Therefore, the feeder system 1 including the fixing board 340 and the flexibly restoring member 360 may rapidly adjust the distance between the guiding members 45 and 46 to match the size of the tube 50 as well as rapidly locating the tube 50 to right position.

Figure 4D:
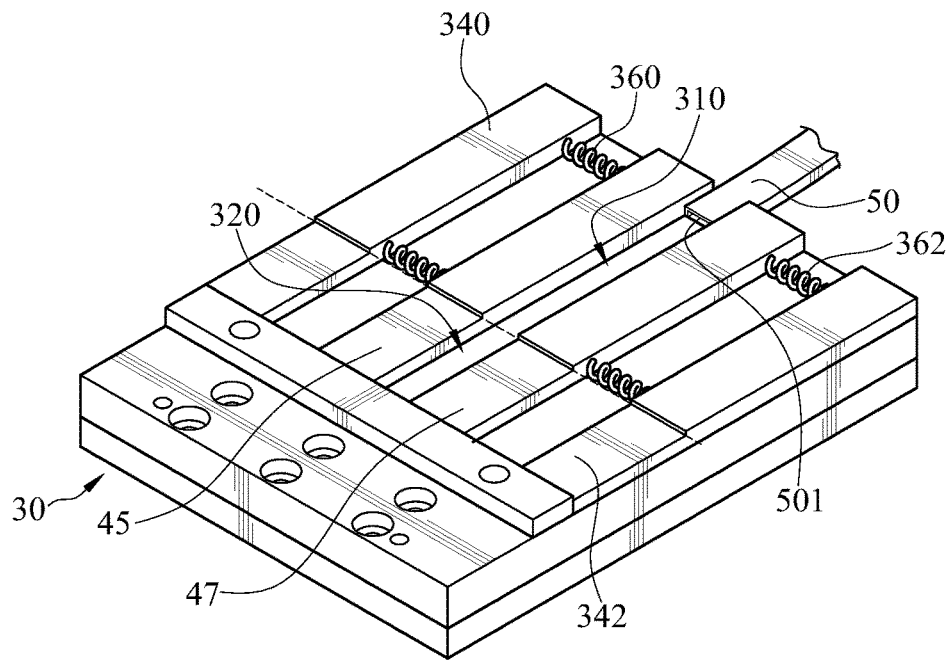
FIG. 4D is a partially perspective view of a feeder system according to still another embodiment of the disclosure.

The following describes the configuration of the guiding member according to other embodiment of the disclosure. Please refer to FIG. 4D, which is a partially perspective view of a feeder system according to still another embodiment of the disclosure. The configuration of this embodiment is similar to that of the embodiment shown in FIG. 4C, so the same numerals represent the same structures, and the repeated description for the same structure is not described again. The material guiding carrier 30 comprises two guiding members 45 and 47, two fixing boards 340 and 342 and two flexibly restoring members 360 and 362. The fixing boards 340 and 342 are fixedly mounted on the material guiding carrier 30, and two ends of the flexibly restoring members 360 and 362 are connected to the fixing boards 340 and 342 and two guiding members 45 and 47, respectively. Thus, the two guiding members 45 and 47 may push two different sides of the tube 50 by forces provided by the flexibly restoring members 360 and 362, respectively. Therefore, the guiding members 45 and 47 respectively connected to the flexibly restoring members 360 and 362 may enhance the clamping effect on the tube 50, thereby rapidly adjusting the distance between the guiding members 45 and 47 to match the size of the tube 50.

To sum up, according to the feeder system and the material guiding carrier thereof provided by the embodiments of the disclosure, the two guiding members may match the tubes with different sizes in the adjustable manner. The material is dropped to the material guiding carrier by the vibration of the transportation platform. Then, the material is conveyed to the material output portion with the guidance of the guiding members. Thus, the feeder system of the disclosure may match all the tubes with different sizes and guide the material to precisely move to the right position of the material output portion, and therefore, the material can be picked up to be machined or assembled. As a result, the feeder system of the disclosure solves the problem that different tubes need to match their specific carrier, which affects the manufacturing cost and efficiency are affected, as well as solving the problem that tapes are required to attach the tube on the carrier, which causes the misalignment of the material.

What is claimed is:

1. A feeder system, for providing a plurality of materials from a tube, comprising:
   a transportation platform; and
   a material guiding carrier mounted on the transportation platform, the material guiding carrier including a material input portion, a material supporting portion, and a material output portion, the material supporting portion being located between the material input portion and the material output portion, the material output portion including a supporting platform, a material output opening of the tube being located at the material input portion, the plurality of materials from the tube being conveyed to the material guiding carrier by the transportation platform, wherein at least two guiding members are mounted on the material guiding carrier, the material input portion, the material supporting portion, and the supporting platform of the material output portion being located between the at least two guiding members, the at least two guiding members extend away from the material output opening of the tube, the at least two guiding members match the tube in an adjustable manner to guide the plurality of materials sliding out of the tube to move sequentially from the material input portion, the material supporting portion, to the supporting platform of the material output portion along a material feeding direction, and wherein the material feeding direction and an arrangement of the at least two guiding members are substantially parallel to each other.

2. The feeder system according to claim 1, wherein one of the two guiding members is fixedly mounted on the material guiding carrier, the other one of the guiding members is relatively mounted on the material guiding carrier in a movable manner, such that a distance between the two guiding members is adjusted for matching the tube.

3. The feeder system according to claim 1, wherein the material guiding carrier further comprises a fixing member, one of the two guiding members includes an adjustable slot, the length of the adjustable slot is greater than an outer diameter of the fixing member, wherein the fixing member detachably penetrates through the adjustable slot and is disposed on the material guiding carrier, the one of the two guiding members is adapted to move towards or away from the other one of the two guiding members along the adjustable slot, such that a distance between the two guiding members is adjusted to match the tube.

4. The feeder system according to claim 1, wherein the material guiding carrier further comprises a fixing board and a flexibly restoring member, the fixing board is fixedly mounted on the material guiding carrier, two ends of the flexibly restoring member are connected to the fixing board and one of the two guiding members, respectively, for adjusting a distance between the two guiding members to match the tube.

5. The feeder system according to claim 4, wherein the flexibly restoring member is a compression spring.

6. The feeder system according to claim 1, wherein the material guiding carrier further comprises a height adjusting member including a pressing portion, the height adjusting member is movably mounted at the material input portion of the material guiding carrier, and the pressing portion is pressed against the tube, wherein the height adjusting member is adapted to adjust a distance between the tube and the material guiding carrier.

7. The feeder system according to claim 6, wherein the height adjusting member penetrates through the material input portion of the material guiding carrier, the height adjusting member is adapted to rotate relative to the material guiding carrier along an axis to drive the pressing portion to move upward or downward relative to the material guiding carrier along the axis.

8. The feeder system according to claim 1, further comprising a placement machine corresponding to the material output portion of the material guiding carrier for picking up the plurality of materials from the material output portion.

9. The feeder system according to claim 8, further comprising a machining platform for carrying a workpiece, the placement machine is adapted to pick up the plurality of materials from the material output portion and place the plurality of materials on the workpiece.

10. The feeder system according to claim 1, further comprising an alignment sensor corresponding to the material output portion, and the alignment sensor is adapted to monitor positions of the plurality of materials.

11. The feeder system according to claim 1, wherein the transportation platform is adapted to vibrate to cause the plurality of materials inside the tube to drop and move to the material guiding carrier.

12. A material guiding carrier, for conveying a plurality of materials from a tube and is mounted on a transportation platform, the material guiding carrier comprising:
  a material input portion, at which a material output opening of the tube being located, and the plurality of materials of the tube being conveyed to the material input portion of the material guiding carrier by the transportation platform;
  a material supporting portion; and
  a material output portion, the material output portion including a supporting platform, the material supporting portion being located between the material input portion and the material output portion, at least two guiding members being mounted on the material guiding carrier, the material input portion, the material supporting portion, and the supporting platform of the material output portion being located between the at least two guiding members, the at least two guiding members extending away from the material output opening of the tube, the at least two guiding members matching for matching the tube in an adjustable manner to guide the plurality of materials as they slide out of the tube to move sequentially from the material input portion, the material supporting portion, to the supporting platform of the material output portion along a material feeding direction;
  wherein the material feeding direction and an arrangement of the at least two guiding members are substantially parallel to each other.

13. The material guiding carrier according to claim 12, wherein one of the two guiding members is fixedly mounted on the material guiding carrier, the other one of the two guiding members is relatively mounted on the material guiding carrier in a movable manner, for adjusting a distance between the two guiding members to match the tube.

14. The material guiding carrier according to claim 12, further comprising a fixing member, one of the two guiding members includes an adjustable slot, the length of the adjustable slot is greater than an outer diameter of the fixing member, wherein the fixing member detachably penetrates through the adjustable slot and is disposed on the material guiding carrier, the one of the two guiding members is adapted to move towards or away from the other one of the two guiding members along the adjustable slot, such that a distance between the two guiding members is adjusted to match the tube.

15. The material guiding carrier according to claim 12, wherein the material guiding carrier further comprises a fixing board and a flexibly restoring member, the fixing board is fixedly mounted on the material guiding carrier, two ends of the flexibly restoring member are connected to the fixing board and one of the two guiding members, respectively, for adjusting a distance between the two guiding members to match the tube.

16. The material guiding carrier according to claim 15, wherein the flexibly restoring member is a compression spring.

17. The material guiding carrier according to claim 12, comprising a height adjusting member including a pressing portion, the height adjusting member is movably mounted at the material input portion of the material guiding carrier, and the pressing portion is pressed against the tube, wherein the height adjusting member is adapted to adjust a distance between the tube and the material guiding carrier.

18. The material guiding carrier according to claim 17, wherein the height adjusting member penetrates through the material input portion of the material guiding carrier, the height adjusting member is adapted to rotate relative to the material guiding carrier along an axis to drive the pressing portion to move upward or downward relative to the material guiding carrier along the axis.

* * * * *